US009590005B1

(12) United States Patent
Qian et al.

(10) Patent No.: US 9,590,005 B1
(45) Date of Patent: Mar. 7, 2017

(54) HIGH DYNAMIC RANGE IMAGE SENSOR WITH REDUCED SENSITIVITY TO HIGH INTENSITY LIGHT (71) Applicant: OMNIVISION TECHNOLOGIES, INC., Santa Clara, CA (US)

(72) Inventors: Yin Qian, Milpitas, CA (US); Ming Zhang, Fremont, CA (US); Chen-Wei Lu, San Jose, CA (US); Jin Li, San Jose, CA (US); Chia-Chun Miao, Santa Clara, CA (US); Dyson H. Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/005,672

(22) Filed: Jan. 25, 2016

(51) Int. Cl.
*H01L 27/146* (2006.01)
(52) U.S. Cl.
CPC .... *H01L 27/14643* (2013.01); *H01L 27/1462* (2013.01); *H01L 27/14685* (2013.01)

(58) Field of Classification Search
CPC .............. H01L 27/14643; H01L 27/14685
See application file for complete search history.

(56) References Cited

U.S. PATENT DOCUMENTS

7,667,749 B2    2/2010    Han

*Primary Examiner* — Long Pham
(74) *Attorney, Agent, or Firm* — Blakely Sokoloff Taylor & Zafman LLP (57) ABSTRACT An image sensor includes first and second pluralities of photodiodes interspersed among each other in a semiconductor substrate. Incident light is to be directed through a surface of the semiconductor substrate into the first and second pluralities of photodiodes. The first plurality of photodiodes has greater sensitivity to the incident light than the second plurality of photodiodes. A metal film layer is disposed over the surface of the semiconductor substrate over the second plurality of photodiodes and not over the first plurality of photodiodes. A metal grid is disposed over the surface of the semiconductor substrate, and includes a first plurality of openings through which the incident light is directed into the first plurality of photodiodes. The metal grid further includes a second plurality of openings through which the incident light is directed through the metal film layer into the second plurality of photodiodes.

11 Claims, 4 Drawing Sheets

HIGH DYNAMIC RANGE IMAGE SENSOR WITH REDUCED SENSITIVITY TO HIGH INTENSITY LIGHT

BACKGROUND INFORMATION

Field of the Disclosure

The present invention relates generally to imaging, and more specifically, the present invention is directed to high dynamic range image sensors.

Background

Image sensors have become ubiquitous. They are widely used in digital cameras, cellular phones, security cameras, as well as, medical, automobile, and other applications. The technology used to manufacture image sensors, such as for example complementary metal-oxide-semiconductor (CMOS) image sensors (CIS), has continued to advance at a great pace. For example, the demands for higher resolution and lower power consumption have encouraged the further miniaturization and integration of these image sensors.

High dynamic range (HDR) image sensors have become useful for many applications. In general, ordinary image sensors, including for example charge coupled device (CCD) and CMOS image sensors, have a dynamic range of approximately 70 dB dynamic range. In comparison, the human eye has a dynamic range of up to approximately 100 dB. There are a variety of situations in which an image sensor having an increased dynamic range is beneficial. For example, image sensors having a dynamic range of 100 dB or more are sometimes needed in the automotive industry in order to be able to handle different extreme lighting conditions, such as driving from a dark tunnel into bright sunlight. Another extreme lighting situation example occurs when imaging light emitting diode (LED) illuminated vehicle lights, traffic lights, and signs that are pulsed at for example 90-300 Hz with high peak light intensity. In these LED lighting situations, there is often flickering present in the output images caused by the LED light sources, which can result in unreliable or inaccurate image sensing.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Examples in accordance with the teaching of the present invention describe a high dynamic range (HDR) image sensor in which light emitting diode (LED) flickering may be reduced. As will be discussed, example HDR image sensors in accordance with the teachings of the present invention include large photodiodes and small diodes. In order to reduce flicking and provide HDR image sensing, the high intensity light sensitivity of the small photo photodiode is reduced significantly. Examples in accordance with the teachings of the present invention utilize a thin metal film layer applied over the semiconductor substrate of the image sensor to cover the small photodiodes so as to reduce the light absorption and therefore reduce the light sensitivity of the small photodiodes. The thickness of the metal film layer may be adjusted to determine the sensitivity of small photodiodes quantitatively. It is appreciated that this approach in accordance with the teachings of the present invention is less sensitive to the process variations. Furthermore, it is appreciated that the process flow is also simpler with less photolithography and etching process steps, and may or may not be implemented utilizing existing pixel layouts in accordance with the teachings of the present invention.

Figure 1:
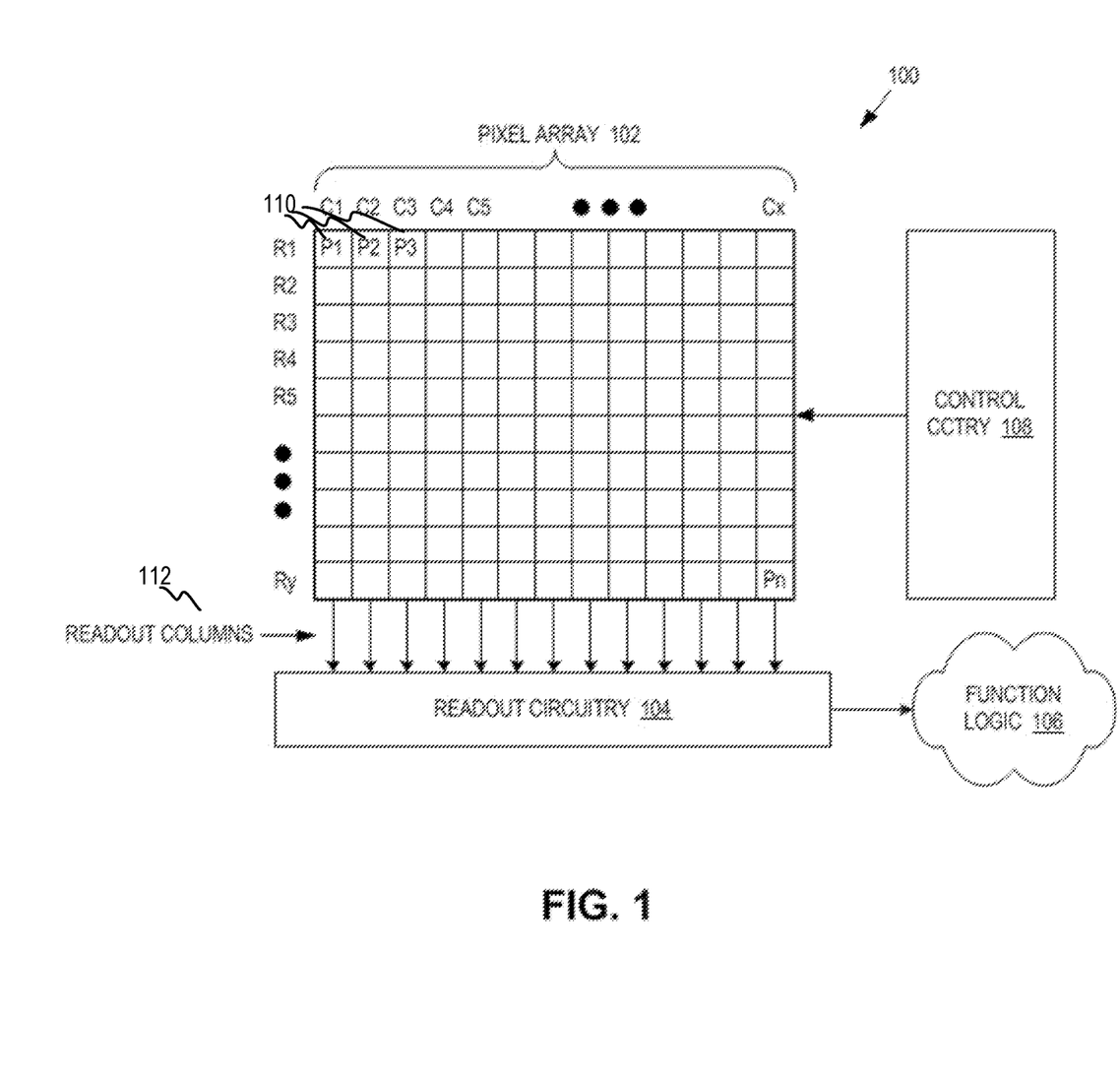
FIG. 1 is a diagram illustrating one example of an imaging system including an example HDR image sensor with reduced sensitivity to high intensity light in accordance with the teachings of the present invention.

To illustrate, FIG. 1 is a diagram that shows generally one example of an HDR imaging system 100 including an example pixel array 102 having pixels 110 in accordance with the teachings of the present invention. As shown in the depicted example, HDR imaging system 100 includes pixel array 102 coupled to control circuitry 108 and readout circuitry 104, which is coupled to function logic 106.

In one example, pixel array 102 is a two-dimensional (2D) array of imaging sensors or pixels 110 (e.g., pixels P1, P2 . . . , Pn). In one example, each pixel 110 is a CMOS imaging pixel including at least a small photodiode, which may also be considered as a short integration photosensitive device, and a large photodiode, which may also be considered as a long integration photosensitive device. As illustrated, each pixel 110 is arranged into a row (e.g., rows R1 to Ry) and a column (e.g., column C1 to Cx) to acquire image data of a person, place, object, etc., which can then be used to render an image of the person, place, object, etc. In one example, the pixels 110 in pixel array 102 include a thin metal film layer applied over the semiconductor substrate of the image sensor to cover the small photodiodes so as to reduce the light absorption and therefore reduce the high intensity light sensitivity of the small photodiodes in accordance with the teachings of the present invention. With the reduced high intensity light sensitivity of the small photodiodes provided with the thin metal film layer, LED flickering is reduced in accordance with the teachings of the present invention.

In one example, after each pixel 110 has acquired its image data or image charge, the image data is read out by readout circuitry 104 through readout columns 112 and then transferred to function logic 106. In various examples, readout circuitry 104 may include amplification circuitry, analog-to-digital (ADC) conversion circuitry, or otherwise. Function logic 106 may simply store the image data or even manipulate the image data by applying post image effects (e.g., crop, rotate, remove red eye, adjust brightness, adjust contrast, or otherwise). In one example, readout circuitry 104 may read out a row of image data at a time along readout column lines (illustrated) or may read out the image data using a variety of other techniques (not illustrated), such as a serial read out or a full parallel read out of all pixels simultaneously.

In one example, control circuitry 108 is coupled to pixel array 102 to control operational characteristics of pixel array 102. For example, control circuitry 108 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows.

Figure 2:
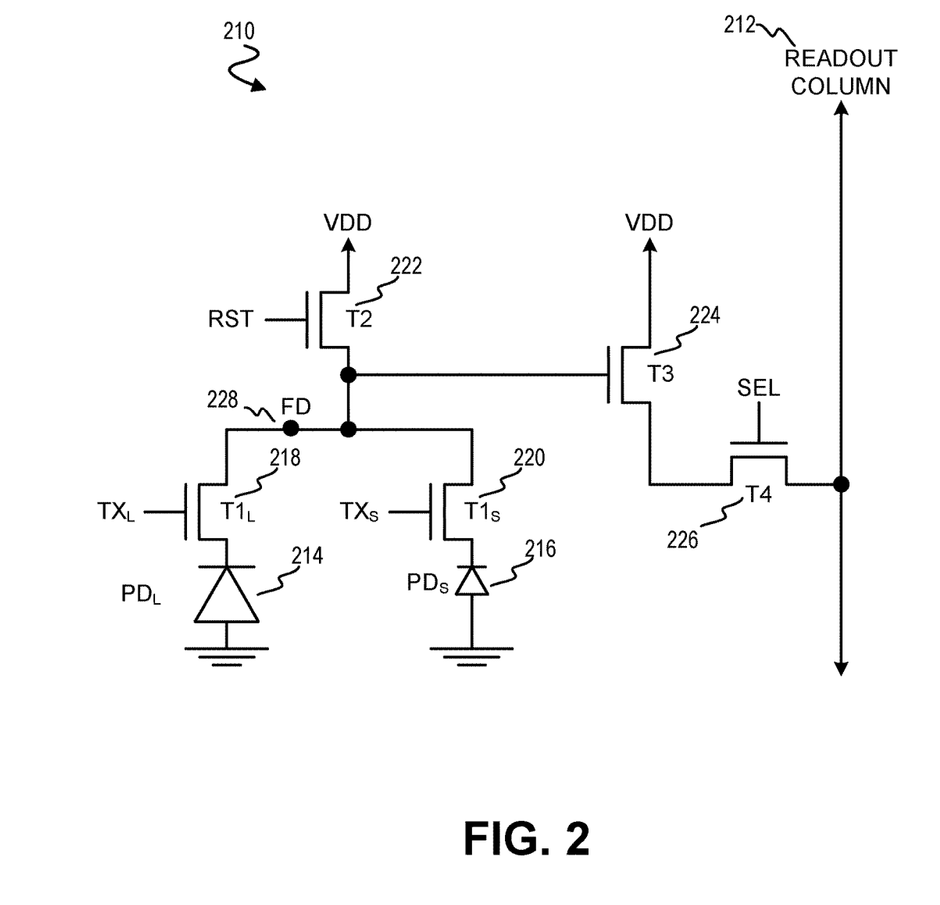
FIG. 2 is a schematic illustrating one example of HDR pixel circuitry of an image sensor with reduced sensitivity to high intensity light in accordance with the teachings of the present invention.

FIG. 2 is a schematic illustrating one example of a pixel 210 in accordance with the teachings of the present invention. In one example, it is appreciated that pixel 210 may be one of the plurality of pixels 110 included in the example pixel array 102 of the HDR image sensor 100 illustrated above in FIG. 1, and that similarly named or numbered elements referenced above are coupled and function similarly as discussed below. It is appreciated that pixel 210 is provided for explanation purposes and therefore represents just one possible architecture for implementing each pixel within pixel array 102 of FIG. 1, and that examples in accordance with the teachings of the present invention are not limited to specific pixel architectures. Indeed, one of ordinary skill in the art having the benefit of the instant disclosure will understand that the present teachings are applicable to 3T, 4T, 5T designs, as well as various other suitable pixel architectures in accordance with the teachings of the present invention.

As shown in the example depicted in FIG. 2, pixel 210 includes a short integration photosensitive device, or small photodiode $PD_S$ 216, and a long integration photosensitive device, or large photodiode $PD_L$ 214. In one example, the large photodiode $PD_L$ 214 has a larger light exposure area than the light exposure area of small photodiode $PD_S$ 216. In one example, there is a thin metal film layer disposed over the small photodiode $PD_S$ 216, and there is no metal film layer disposed over the large photodiode $PD_L$ 214. As a result, the large photodiode $PD_L$ 214 has higher sensitivity to incident light and is therefore utilized for lower light intensity sensing. Since the small photodiode $PD_S$ 216 on the other hand has less light exposure area, and since there is a thin metal film layer disposed over the small photodiode $PD_S$ 216, it is less sensitive to high intensity light compared to the large photodiode $PD_L$ 214, and is therefore utilized for higher light intensity sensing. By utilizing both a large photodiode $PD_L$ 214 and small photodiode $PD_S$ 216 in pixel 210, HDR imaging sensing is realized.

Continuing with example depicted in FIG. 2, charge that is accumulated in large photodiode $PD_L$ 214 is switched through transfer transistor $T1_L$ 218 to a floating drain FD 228 in response to a control signal $TX_L$, and charge that is accumulated in small photodiode $PD_S$ 216 is switched through transfer transistor $T1_S$ 220 to floating drain FD 228 in response to a control signal $TX_S$.

As shown in the example, pixel 210 also includes an amplifier transistor T3 224 that has a gate terminal coupled to floating drain FD 228. Thus, in the illustrated example, the charges from large photodiode $PD_L$ 214 and small photodiode $PD_S$ 216 are separately switched to floating drain FD 228, which is coupled to amplifier transistor T3 224. In one example, amplifier transistor T3 224 is coupled in a source follower configuration as shown, which therefore amplifies an input signal at the gate terminal of amplifier transistor T3 224 to an output signal at the source terminal of amplifier transistor T3 224. As shown, row select transistor T4 226 is coupled to the source terminal of amplifier transistor T3 224 to selectively switch the output of amplifier transistor T3 224 to readout column 212 in response to a control signal SEL. As shown in the example, pixel 210 also includes reset transistor 241 coupled to floating drain FD 228, large photodiode $PD_L$ 214 and small photodiode $PD_S$ 216, which may be used to reset charge accumulated in pixel 210 in response to a reset signal RST. In one example, the charge accumulated in floating drain FD 228, large photodiode $PD_L$ 214, and small photodiode $PD_S$ 216 can be reset during an initialization period of pixel 210, or for example each time after charge information has been read out from pixel 210 and prior to accumulating charge in large photodiode $PD_L$ 214 and small photodiode $PD_S$ 216 for the acquisition of a new HDR image in accordance with the teachings of the present invention.

Figure 3A:
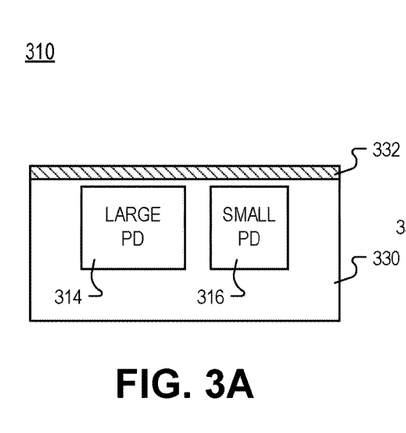
FIG. 3A illustrates a cross-section view of a portion of one example of a pixel of an image sensor including a metal film layer disposed over a surface of a semiconductor substrate having first and second pluralities of photodiodes arranged therein in accordance with the teachings of the present invention.

FIG. 3A illustrates a cross-section view of a portion of one example of a portion of a pixel 310 of an image sensor in accordance with the teachings of the present invention. In one example, it is appreciated that pixel 310 may be one example of the plurality of pixels 110 included in the example pixel array 102 of the HDR image sensor 100 illustrated above in FIG. 1, or pixel 210 as illustrated above in FIG. 2, and that similarly named or numbered elements referenced above are coupled and function similarly as discussed below. It is appreciated that pixel 310 is provided for explanation purposes and therefore represents just one possible cross-section illustration for implementing each pixel within pixel array 102 of FIG. 1, or pixel 210 as illustrated above in FIG. 2, and that examples in accordance with the teachings of the present invention are not limited to the specific pixel cross-section illustration example as shown.

Referring back to the example depicted in FIG. 3A, pixel 310 is included in an image sensor including a plurality of photodiodes arranged in semiconductor substrate 330. The plurality of photodiodes includes a first plurality of large photodiodes, which includes large photodiode 314, and a second plurality of small photodiodes, which includes small photodiode 316. In the example, the large photodiodes 314 and small photodiodes 316 are interspersed among each other in a pixel array arranged in the semiconductor substrate 330 to detect incident light. In the example, the large photodiode 314 has greater sensitivity to incident light than small photodiode 316. As shown in the depicted example, a metal film layer 332 is disposed over a surface of the semiconductor substrate 330 as shown.

Figure 3B:
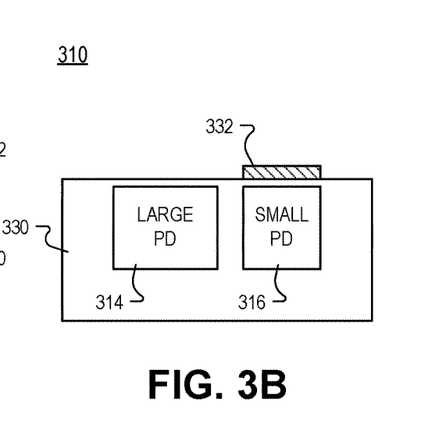
FIG. 3B illustrates a cross-section view of the portion of a pixel of the example the image sensor in which the metal film layer is disposed only over the second plurality of photodiodes in accordance with the teachings of the present invention.

FIG. 3B illustrates a cross-section view of the portion of the pixel 310 of the example of the image sensor after metal film layer 332 is selectively etched. In particular, FIG. 3B illustrates that metal film layer 332 is selectively etched such that metal film layer 332 is disposed over the small photodiode 316, and there is no metal film layer 332 over large photodiode 314 in accordance with the teachings of the present invention.

Figure 3C:
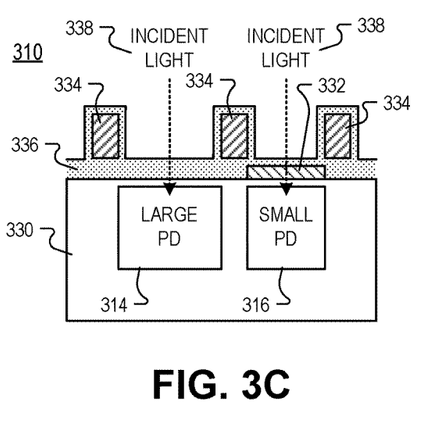
FIG. 3C illustrates a cross-section view of the portion of a pixel of the example of the image sensor in which a metal grid having first and second pluralities of openings is disposed over the semiconductor substrate in accordance with the teachings of the present invention.

FIG. 3C illustrates a cross-section view of the example of the portion of the pixel 310 of the image sensor in which a metal grid 334 is disposed over the small photodiode 316 in the semiconductor substrate 330 in accordance with the teachings of the present invention. In particular, FIG. 3C illustrates that metal grid 334 includes first and second pluralities of openings that are disposed over the semiconductor substrate 330. The first plurality of openings in metal grid 334 include the respective opening over the large photodiode 314, and the second plurality of openings in metal grid 334 include the respective opening over the small photodiode 316 as shown. In the depicted example, a passivation layer 336 is also deposited over the metal grid 334, the metal film layer 332, and the surface of semiconductor substrate 330 as shown.

In operation, incident light 338 is directed through the openings in the metal grid 334 and through the surface of the semiconductor substrate 330 into the respective photodiodes as shown. In particular, the example depicted in FIG. 3C illustrates that metal grid 334 includes an opening through which the incident light 338 is directed through metal grid 334, and then through the surface of semiconductor 330 into the large photodiode 314. However, metal grid 334 also includes an opening through which the incident light 338 is directed through the metal grid 334, and then through the metal film layer 332 and then through the surface of semiconductor 330 into the small photodiode 316 in accordance with the teachings of the present invention.

It is appreciated that with metal film layer 332 disposed along the optical path of incident light 338 directed into only the small photodiodes 336 of the image sensor including pixel 310, the light sensitivity of the small photodiodes 316 is further reduced, which addresses the LED flickering issue in accordance with the teachings of the present invention. In one example, the high intensity light sensitivity, or the light absorption, of small photodiodes 316 is reduced for example up to 15 times with metal film layer 332. The transmittance of the incident light 338 through the metal film layer 332 is responsive to a thickness of the metal film layer 332. Therefore, the transmittance of the incident light 338 into small photodiodes 316 may be adjusted by controlling the thickness of the metal film layer 332 with selective etching. Indeed, the final thickness of the metal film layer 332 may be selected based on a transparency vs. thickness plot.

In one example, metal film layer 332 may be comprised of aluminum, tungsten, titanium, titanium nitride, or another suitable thin metal layer film to adjust the transmittance of the incident light 338 in accordance with the teachings of the present invention. In one example, the metal grid 334 may be comprised of aluminum, titanium nitride, or another other suitable material to fabricate a metal grid to direct incident light 338 through the openings into the respective photodiodes in semiconductor substrate 330. When fabricating the image sensor, the deposition processes utilized may be PVD, ALD, CVD, or any other suitable deposition process.

In addition, in one example, it is appreciated that by including metal film layer 332 only over the small photodiodes 316 as discussed, the dimensions of the large and small photodiodes 314 and 316 do not necessarily need to be changed, and therefore the standard pixel layouts do not need to be changed in accordance with the teachings of the present invention to reduce LED flickering.

Figure 4A:
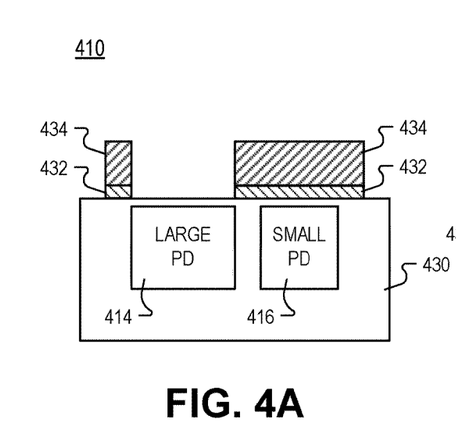
FIG. 4A illustrates a cross-section view of a portion of another example of a pixel of an image sensor including a metal grid film stack having first and second layers disposed over a surface of a semiconductor substrate having first and second pluralities of photodiodes arranged therein in accordance with the teachings of the present invention.

FIG. 4A illustrates a cross-section view of a portion of another example of a pixel 410 of an image sensor in accordance with the teachings of the present invention. In one example, it is appreciated that pixel 410 may be another example of the plurality of pixels 110 included in the example pixel array 102 of the HDR image sensor 100 illustrated above in FIG. 1, or pixel 210 as illustrated above in FIG. 2. It is appreciated that pixel 410 is provided for explanation purposes and therefore represents just one possible cross-section illustration for implementing each pixel within pixel array 102 of FIG. 1, or pixel 210 as illustrated above in FIG. 2, and that examples in accordance with the teachings of the present invention are not limited to the specific pixel cross-section illustration example as shown.

Referring back to the example depicted in FIG. 4A, pixel 410 is included in an image sensor including a plurality of photodiodes arranged in semiconductor substrate 430. The plurality of photodiodes includes a first plurality of large photodiodes, which includes large photodiode 414, and a second plurality of small photodiodes, which includes small photodiode 416. In the example, the large photodiodes 414 and small photodiodes 416 are interspersed among each other in the pixel array arranged in the semiconductor substrate 430 to detect incident light. In the example, the large photodiode 414 has greater sensitivity to incident light than small photodiode 416.

As shown in the depicted example, a metal grid film stack having first and second layers 432 and 434 is disposed over a surface of a semiconductor substrate 430 having the first and second pluralities of photodiodes 414 and 416. In one example, the first layer 432 may be comprised of titanium nitride, aluminum, tungsten, titanium, or another suitable material to provide a thin metal layer film, and the second layer 434 may be comprised of aluminum, titanium nitride, or another other suitable material to fabricate a metal grid.

In one example, the first and second layers 432 and 434 of the metal grid film stack are first deposited over the entire surface of semiconductor substrate 430. In one example, the first and second layers 432 and 434 of the metal grid film stack are then selectively etched completely over large photodiodes 414 down to the surface of the semiconductor substrate 430 as shown in FIG. 4A to form and openings and expose the large photodiode 414 to incident light.

Figure 4B:
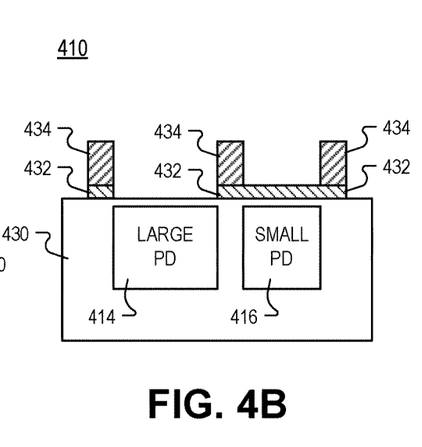
FIG. 4B illustrates a cross-section view of the portion of the other example of a pixel of the image sensor after selective etching such that a metal film layer is disposed only over the second plurality of photodiodes, and a metal grid having first and second pluralities of openings is disposed over the semiconductor substrate in accordance with the teachings of the present invention.

Continuing with the example depicted in FIG. 4B, the second layer 434 of the metal grid film stack is then selectively etched over the small photodiodes 416 to form openings through the resulting grid formed with second layer 434 through which the incident light may be directed. As illustrated, the etching of the second layer 434 over the small photodiodes 416 is stopped at or partially into the barrier of the first layer 432 such that the metal film layer provided by first layer 432 remains over small photodiodes 416, and such that the metal grid having openings over the large and small photodiodes 414 and 416 is provided second layer 434.

Figure 4C:
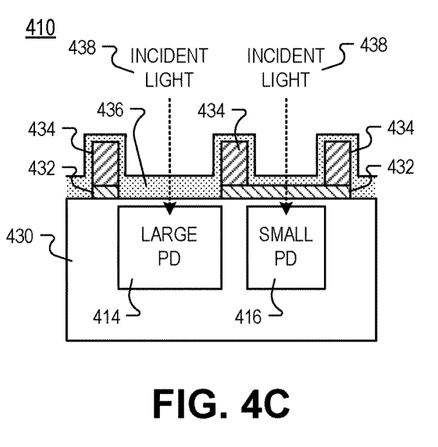
FIG. 4C illustrates a cross-section view of the portion of the other example of a pixel of the image sensor in which a passivation layers is disposed over the metal grid, the metal layer, and the surface of the semiconductor substrate in accordance with the teachings of the present invention.

After the etching of the second layer 434 over the small photodiodes 416, FIG. 4C illustrates that a passivation layer 436 may then be deposited over the metal grid formed with second layer 434, the then metal layer formed with first layer 432, and the surface of the semiconductor substrate 430 over the large photodiodes 414 as shown.

In operation, incident light 438 is directed through the openings in the metal grid formed with second layer 434 and through the surface of the semiconductor substrate 430 into the respective photodiodes as shown. In particular, the example depicted in FIG. 4C illustrates that the metal grid formed with second layer 434 includes an opening through which the incident light 438 is directed through metal grid 434, and then through the surface of semiconductor 430 into the large photodiode 414. Metal grid 434 also includes an opening through which the incident light 438 is directed through the metal grid 434, and then through the metal film layer 432 and then through the surface of semiconductor 430 into the small photodiode 416 in accordance with the teachings of the present invention.

With the metal film layer provided with first layer 432 along the optical path of incident light 438 into only the small photodiodes 436 of the image sensor, the high intensity light sensitivity of the small photodiodes 416 is further reduced, which addresses the LED flickering issue in accordance with the teachings of the present invention. In one example, the high intensity light sensitivity, or the light absorption, of small photodiodes 416 is reduced for example up to 15 times with the metal film layer provided with first layer 432. The transmittance of the incident light 438 through the metal film layer provided with first layer 432 is responsive to a thickness of the first layer 432. Therefore, the transmittance of the incident light 438 into small photodiodes 416 may be adjusted by controlling the final thickness of the first layer 432 when selectively etching second layer 434.

It is appreciated that by including first layer 432 only over the small photodiodes 416 as discussed, the dimensions of the large and small photodiodes 414 and 416 do not necessarily need to be changed, and therefore the standard pixel layouts do not need to be changed, even tough the LED flickering issue is addressed in accordance with the teachings of the present invention.

Figure 5:
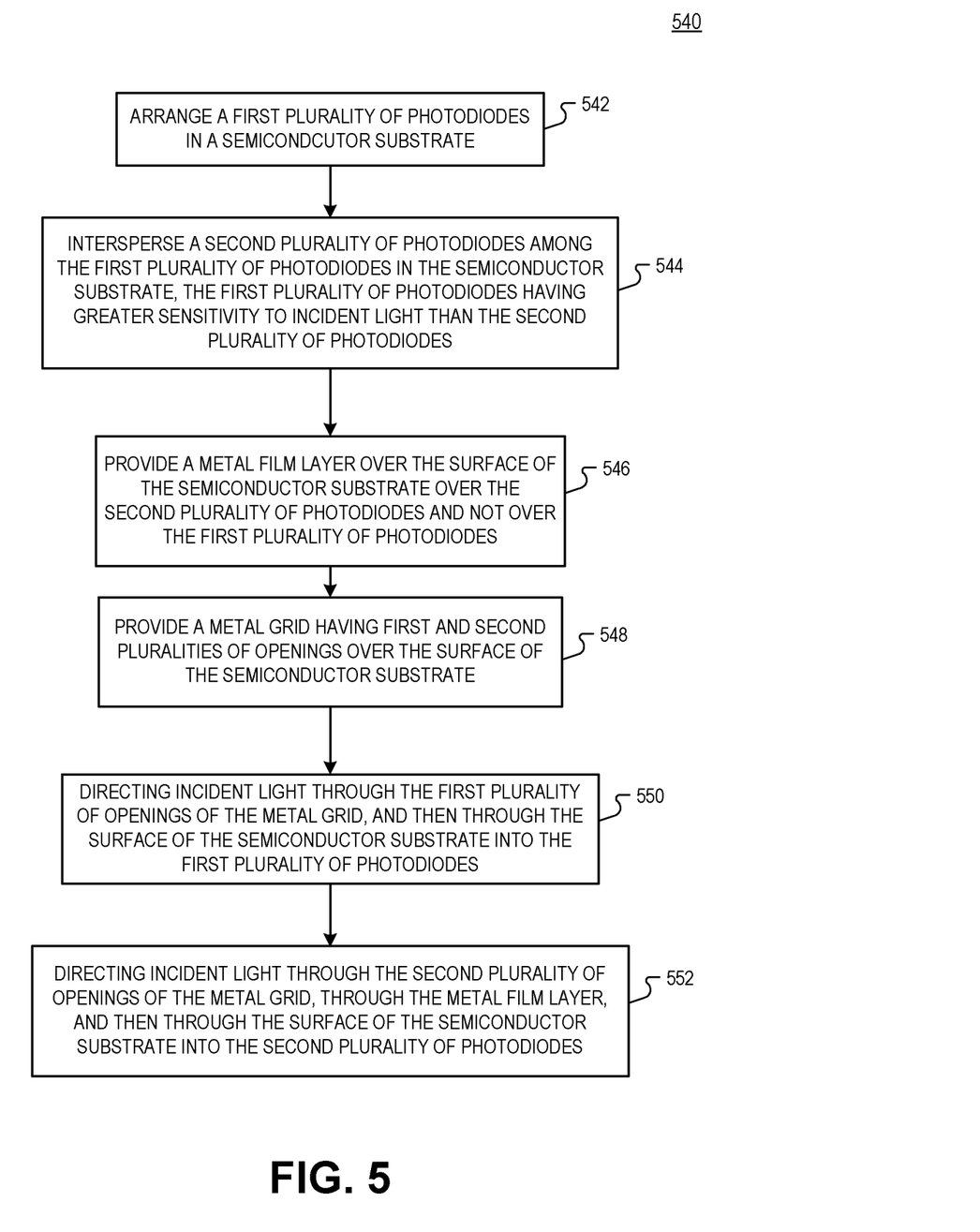
FIG. 5 illustrates an example process for fabricating an image sensor in accordance with the teachings of the present invention.

FIG. 5 illustrates an example process 540 for implementing an image sensor in accordance with the teachings of the present invention. In one example, it is appreciated that process 540 may be one example of providing the pixels 110 included in the example pixel array 102 of the HDR image sensor 100 illustrated above in FIG. 1, or pixel 210 as illustrated above in FIG. 2., or pixel 310 as illustrated above in FIGS. 3A-3C, or pixel 410 as illustrated above in FIGS. 4A-4C, and that similarly named or numbered elements referenced above are coupled and function similarly as discussed below.

It should be noted that process 540 may only describe a portion of the process for implementing an image sensor in accordance with the teachings of the present invention, and that several other steps may have been omitted in order to avoid obscuring certain aspects. In addition, the order in which some or all of the process blocks appear in process 540 should not be deemed limiting. Rather, one of ordinary skill in the art having the benefit of the present disclosure will understand that at least some of the process blocks described in process 540 may occur in a variety of orders not illustrated, or even in parallel.

For instance, referring back to process 540 as shown in FIG. 5, process block 542 shows that a first plurality of photodiodes is arranged in a semiconductor substrate. Process block 544 shows that a second plurality of photodiodes is interspersed among the first plurality of photodiodes in the semiconductor substrate. In the example, the first plurality of photodiodes has greater sensitivity to the incident light than the second plurality of photodiodes. Incident light is to be directed through a surface of the semiconductor substrate into the first and second pluralities of photodiodes.

Process block 546 shows that a metal film layer is provided over the surface of the semiconductor substrate over the second plurality of photodiodes and not over the first plurality of photodiodes. A transmittance of the incident light through the metal film layer is responsive to a thickness of the metal film layer. In one example, the final thickness of the metal film layer can be adjusted or controlled with a selective etch.

In one example, the metal film layer may be deposited over an entire surface of the semiconductor substrate over the first and second plurality of photodiode, after which time the metal film layer is patterned or etched to leave the metal film layer, or a portion of the metal film layer, remaining only over the second plurality of photodiodes.

Process block 548 shows that a metal grid is also provided over the surface of the semiconductor substrate. The metal grid includes a first plurality of openings through which the incident light is directed through metal grid, and then through the surface into the first plurality of photodiodes. The metal grid further includes a second plurality of openings through which the incident light is directed through the metal grid, and then through the metal film layer and the surface into the second plurality of photodiodes. In one example, a passivation layer may also be deposited over the metal grid, the metal layer, and the surface of the semiconductor substrate.

In one example, with respect to process blocks 546 and 548, it is appreciated that a metal grid film stack including first and second layers may be deposited over an entire surface of the semiconductor substrate over the first and second plurality of photodiodes. The metal film layer is provided with the first layer of the metal grid film stack, and the metal grid is provided from the second layer of the metal grid film stack. The first and second layers of the metal grid film stack may then be etched completely over the first plurality of photodiodes to form the first plurality of openings through which the incident light is directed through metal grid, and then through the surface into the first plurality of photodiodes. The second layer of the metal grid film stack may be etched selectively over the second plurality of photodiodes to form the second plurality of openings through which the incident light is directed through the metal grid, and then through the metal film layer and the surface into the second plurality of photodiodes. A transmittance of the incident light through the first layer of the metal grid film stack is responsive to a thickness of the first layer. In one example, the final thickness of the first layer, or the portion of the first layer, of the metal grid film stack over the small photodiodes can be adjusted or controlled with a selective etch.

Process block 550 shows that incident light may be directed through the first plurality of openings of the metal grid, and then through the surface of the semiconductor substrate into the first plurality of photodiodes. Process block 552 shows that incident light may be directed through the second plurality of openings of the metal grid, through the metal film layer, and then through the surface of the semiconductor substrate into the second plurality of photodiodes.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A method of fabricating an image sensor, comprising:
   arranging a first plurality of photodiodes in a semiconductor substrate;
   interspersing a second plurality of photodiodes among the first plurality of photodiodes in the semiconductor substrate, wherein incident light is to be directed through a surface of the semiconductor substrate into the first and second pluralities of photodiodes, wherein the first plurality of photodiodes have greater sensitivity to the incident light than the second plurality of photodiodes;
   providing a metal film layer over the surface of the semiconductor substrate over the second plurality of photodiodes and not over the first plurality of photodiodes; and
   providing a metal grid over the surface of the semiconductor substrate, wherein the metal grid includes a first plurality of openings through which the incident light is directed through metal grid, and then through the surface into the first plurality of photodiodes, wherein the metal grid further includes a second plurality of openings through which the incident light is directed through the metal grid, and then through the metal film layer and the surface into the second plurality of photodiodes.

2. The method of claim 1, wherein said providing the metal film layer over the surface of the semiconductor substrate over the second plurality of photodiodes and not over the first plurality of photodiodes comprises:
   depositing the metal film layer over an entire surface of the semiconductor substrate over the first and second plurality of photodiodes; and
   patterning the metal film layer to leave the metal film layer only over the second plurality of photodiodes.

3. The method of claim 1, wherein said providing the metal film layer over the surface of the semiconductor substrate over the second plurality of photodiodes and not over the first plurality of photodiodes, and said providing the metal grid disposed over the surface of the semiconductor substrate, comprises:
   depositing a metal grid film stack over an entire surface of the semiconductor substrate over the first and second plurality of photodiodes, wherein the metal grid film stack includes a first layer and a second layer, wherein the metal film layer is formed from the first layer of the metal grid film stack, wherein the metal grid is formed from the second layer of the metal grid film stack;
   etching completely the first and second layers of the metal grid film stack over the first plurality of photodiodes to form the first plurality of openings through which the incident light is directed through metal grid, and then through the surface into the first plurality of photodiodes; and
   etching selectively the second layer of the metal grid film stack over the second plurality of photodiodes to form the second plurality of openings through which the incident light is directed through the metal grid, and then through the metal film layer and the surface into the second plurality of photodiodes.

4. The method of claim 3 wherein said etching selectively the second layer of the metal grid film stack over the second plurality of photodiodes further comprises etching selectively a portion of the first layer of the metal grid film stack over the second plurality of photodiodes to adjust a thickness of the metal film layer only over the second plurality of photodiodes, wherein a transmittance of the incident light through the metal film layer is responsive to a thickness of the metal film layer.

5. The method of claim 1, further comprising depositing a passivation layer over the metal grid, the metal layer, and the surface of the semiconductor substrate.

6. The method of claim 1, wherein the metal film layer comprises aluminum.

7. The method of claim 1, wherein the metal film layer comprises tungsten.

8. The method of claim 1, wherein the metal film layer comprises titanium.

9. The method of claim 1, wherein the metal film layer comprises titanium nitride.

10. The method of claim 1, wherein the metal grid comprises aluminum.

11. The method of claim 1, wherein the metal grid comprises titanium nitride.

\* \* \* \* \*